United States Patent [19]

Colvin et al.

[11] Patent Number: 5,307,025
[45] Date of Patent: Apr. 26, 1994

[54] AUDIO POWERW AMPLIFIER WITH NOISE PREVENTION AT TURN-ON AND TURN-OFF

[75] Inventors: Bryan J. Colvin; Michael S. Rovner, both of San Jose, Calif.

[73] Assignee: Media Vision, Inc., Fremont, Calif.

[21] Appl. No.: 913,667

[22] Filed: Jul. 14, 1992

[51] Int. Cl.$^5$ ............................................... H03F 1/26
[52] U.S. Cl. ..................................... 330/267; 330/149
[58] Field of Search ................ 330/51, 149, 267, 273; 381/94

[56] References Cited

U.S. PATENT DOCUMENTS 3,889,202 6/1975 Suzuki ........................... 330/267 X
4,015,215 3/1977 Seki ................................ 330/297 X Primary Examiner—James B. Mullins
Attorney, Agent, or Firm—Skjerven, Morrill, MacPherson Franklin and Friel

[57] ABSTRACT

An audio power amplifier is provided that includes circuitry to prevent popping noises when the amplifier is turned on and turned off. The amplifier can be powered with a single-ended voltage power supply, and thus may be used within systems such as personal computer. The amplifier includes a control circuit that prevents the fast charging of the output AC coupling capacitor when the amplifier is turned on and turned off. The control circuit controls a driver stage such that the output transistors turn on slowly when power is first applied, and such that the output transistors turn off quickly when the supply voltage is removed.

14 Claims, 1 Drawing Sheet

AUDIO POWERW AMPLIFIER WITH NOISE PREVENTION AT TURN-ON AND TURN-OFF

BACKGROUND OF THE INVENTION

1. Field of the Invention

The present invention relates to audio power amplifiers and more particularly to audio power amplifiers having single-ended power supplies.

2. Description of the Relevant Art

A variety of audio power amplifiers are well known in the art. When an audio power amplifier is used in a system having a single-ended power supply, such as a power supply providing a positive voltage with respect to ground and no negative voltage, the amplifier is typically designed with a push-pull configured output stage including a large AC coupling capacitor connected at the output terminal of the amplifier. The large AC coupling capacitor is included to maintain the DC output level at zero volts. Since an input signal provided to the power amplifier is level shifted to an average voltage which is intermediate between the positive supply and ground to allow the signal to vary between the supply voltages, the AC coupling capacitor blocks the intermediate DC voltage at the push-pull output stage to thereby provide an output signal with a zero volt DC level.

A problem associated with such audio power amplifiers is a loud popping noise generated by the amplifier at turn-on and turn-off. The popping noise generated by the amplifier is the result of the quick charging and discharging of the large AC coupling capacitor at turn-on and turn-off. An audio power amplifier that is not associated with this popping characteristic is desirable.

SUMMARY OF THE INVENTION

In accordance with the present invention, an audio power amplifier is provided that includes circuitry to prevent popping noises when the amplifier is turned on and turned off. The amplifier can be powered with a single-ended voltage power supply, and thus may be used within systems such as personal computers. The amplifier includes a control circuit that prevents the fast charging of the output AC coupling capacitor when the amplifier is turned on and turned off. The control circuit controls a driver stage such that the output transistors turn on slowly when power is first applied, and such that the output transistors turn off quickly when the supply voltage is removed.

These and other advantages are attained by the present invention, in accordance with which an audio power amplifier comprises an output stage including at least a pair of output transistors, a driver stage coupled to the output stage and including at least a pair of driver transistors, and means for gradually switching on the output transistors when power is applied to the amplifier.

The invention will be more readily understood with reference to the drawing and the detailed description. As will be appreciated by one skilled in the art, the invention is applicable to amplifier circuits in general, and is not limited to the specific embodiment disclosed.

DETAILED DESCRIPTION

Figure 1:
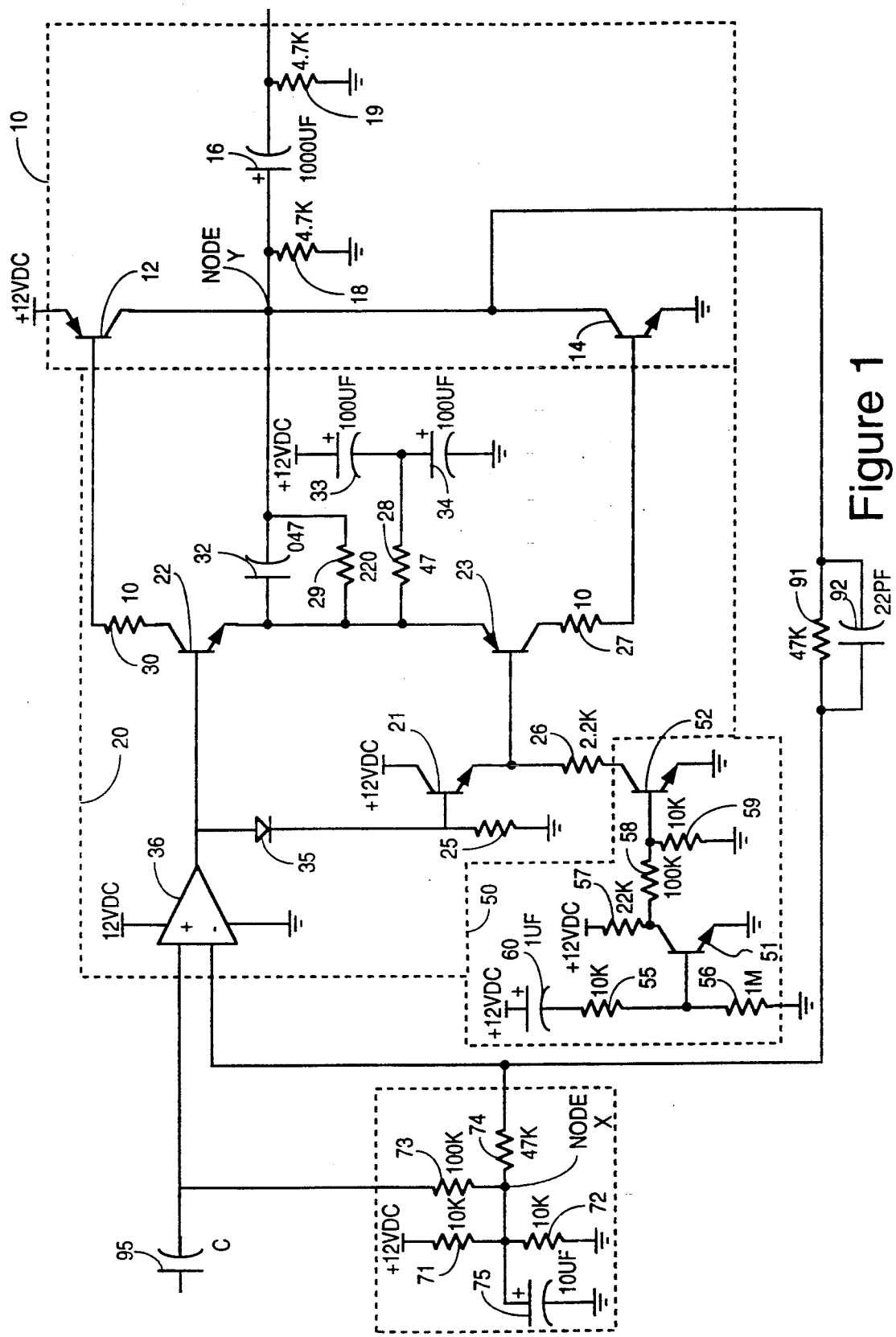
FIG. 1 is a schematic of an audio power amplifier with noise prevention in accordance with the present invention.

The following includes a detailed description of the best presently contemplated mode for carrying out the invention. The description is intended to be merely illustrative of the invention and should not be taken in a limiting sense.

Referring to FIG. 1, a preferred embodiment of a power amplifier with noise prevention in accordance with the present invention is shown. The amplifier comprises an output stage 10 that includes a PNP bipolar power transistor 12, an NPN bipolar power transistor 14, an AC coupling capacitor 16, and resistors 18 and 19. The amplifier further comprises a driving stage 20 including NPN bipolar transistors 21-23, resistors 25-30, capacitors 32-34, a diode 35, and an operational amplifier 36. The circuit additionally comprises a control circuit 50 including NPN bipolar transistors 51 and 52, resistors 55-59, and capacitor 60. A bias circuit 70 is also provided within the amplifier circuit and includes resistors 71-74 and a capacitor 75. The circuit finally includes resistor 91 and capacitor 92 for feedback loop compensation and an AC input coupling capacitor 95.

It is noted that in the embodiment of FIG. 1 the output stage 10 is implemented in a push-pull configuration. It is furthermore noted that operational amplifier 36 is implemented using a type LM358A integrated circuit chip.

During initial operation of the amplifier circuit when a 12 volt supply is first provided at the supply terminals of the amplifier, the voltage level at node X connecting capacitor 75 and resistors 71 and 72 increases from a level of zero volts to approximately 6 volts as capacitor 75 charges. The voltage levels at both input terminals and the output terminal of operational amplifier 40 correspondingly increase from zero volts to approximately 6 volts. As the voltage at the base of transistor 22 increases, transistor 22 is slowly biased on. Diode 35 and transistor 21 are provided to establish a proper bias voltage between transistors 22 and 23.

Control circuit 50 is provided to prevent the output transistors 12 and 14 from turning on too quickly at power turn-on and for turning off the output transistors 12 and 14 quickly when the power supply is turned off. In this embodiment, the control circuit 50 directly controls driver transistor 23 to achieve a slow turn-on characteristic and a fast turn-off characteristic at the output stage 10. When the power supply is first turned on, capacitor 60 is discharged and thus a relatively high voltage is supplied to the base of transistor 51. Transistor 51 correspondingly turns on which brings the voltage level at the base of transistor 52 low. Transistor 52 is thus biased off. Since transistor 52 is turned off, driver transistors 22 and 23 are also forced off.

As capacitor 60 charges, the voltage at the base of transistor 51 drops to zero, thus turning transistor 51 off. Transistor 52 correspondingly turns on and current thus flows through transistor 21 which biases transistor 23 on.

After capacitors 60 and 75 have charged to a steady state, as well as capacitors 33 and 34, the node Y connecting the collectors of transistors 12 and 14 is biased at a level of approximately 6 volts. Thus, an AC input signal can swing within the voltage rails between the 12 volt supply and ground. An AC input signal provided to the input line passes through operational amplifier 36 and is amplified by driver transistors 22 and 23.

It is noted that the time constant associated with capacitor 75 is larger than the time constant associated with output capacitor 16. This characteristic assures that the average voltage at the output line remains zero. It is also noted that since the control circuit 50 prevents driver transistor 23 from turning on quickly, a glitch generated at the output terminal of operational amplifier 36 during the charge-up time of capacitor 75 will not be amplified and to thus a popping noise in a speaker connected at the output line will not be generated.

The amplification of the driver stage 20 is controlled by the ratio of resistors 28 and 29. At power turn-on, the node connecting capacitors 33 and 34 increases from 0 volts to 6 volts at a rate that corresponds to the rate at which the power supply turns on. Capacitors 33 and 34 provide the proper bias to operate node Y at 6 volts. The incorporation of capacitor 34 assures that the voltage at node Y directly tracks the median point between the supply voltage and ground. Thus, capacitor 34 also prevents transients at the output during turn-on and turn-off.

When the amplifier is turned off, the 12 volt supply is removed from resistor 57 and thus transistor 52 turns off. When transistor 52 turns off, transistor 23 is biased off and thus the driver stage 20 is disabled. This forces the output transistors 12 and 14 to turn off. Thus, any voltage charged across the AC coupling capacitor 16 is discharged by current flow-through resistors 18 and 19. The time constant of this output network is relatively high, and thus popping noises at a connected speaker do not occur.

Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in a limiting sense. The scope of the claimed invention is better defined with reference to the following claims.

We claim:

1. An audio power amplifier comprising:
   an output stage including at least a pair of output transistors;
   a driver stage coupled to said output stage and including at least a pair of driver transistors;
   voltage biasing means coupled to said driver stage for biasing said pair of driver transistors at a predetermined operating point during steady state conditions; and
   a control circuit coupled to said voltage biasing means for controlling the biasing of said pair of driver transistors when a power source connected to said audio power amplifier changes state, wherein said control circuit includes means for limiting a rate at which the biasing of said driver transistors changes from an unbiased condition to said predetermined operating point when said power source is initially turned on, and wherein said control circuit also includes means for substantially instantaneously changing the biasing of said driver transistors from said predetermined operating point to said unbiased condition, said changing occurring when said power source is turned off.

2. The audio power amplifier as recited in claim 1 wherein said control circuit comprises:
   a capacitor coupled to said power source; and
   a control transistor having a conductivity that varies depending upon a charge across said capacitor and coupled to a control terminal of one of said driver transistors such that the biasing of said pair of driver transistors is dependent upon the charge across said capacitor while said power source is turned on.

3. The audio power amplifier as recited in claim 2 wherein said capacitor limits a rate at which the biasing of said driver transistors changes from said unbiased condition to said predetermined operating point.

4. The audio power amplifier as recited in claim 3, wherein said capacitor is substantially instantaneously isolated from said driver transistors when said power source is turned off, such that said capacitor does not limit a rate at which the biasing of said driver transistors changes from said predetermined operating point to said unbiased condition when said power source is turned off.

5. An audio power amplifier comprising:
   an output stage including a first output transistor and a second output transistor, said first and second output transistors connected in a push-pull configuration;
   a driver stage coupled to said output stage and including at least a pair of driver transistors for driving said first and second output transistors;
   voltage biasing means coupled to said driver stage for biasing said pair of driver transistors at a predetermined operating point during steady state conditions, wherein said biasing means includes at least a first diode coupled between said pair of driver transistors; and
   a control circuit coupled to said voltage biasing means for controlling the biasing of said pair of driver transistors when a power source connected to said audio power amplifier changes state, wherein said control circuit includes a capacitor for limiting a rate at which the biasing of said driver transistors changes from an unbiased condition to said predetermined operating point when said power source is initially turned on, and wherein said control circuit also includes means for substantially instantaneously changing the biasing of said driver transistors from said predetermined operating point to said unbiased condition, independent of a time constant associated with said capacitor, said changing occurring when said power source is turned off.

6. The audio power amplifier as recited in claim 5 wherein said control circuit further comprises a control transistor having a conductivity that varies depending upon a charge across said capacitor and coupled to a control terminal of one of said driver transistors such that the biasing of said pair of driver transistors is dependent upon the charge across said capacitor while said power source is turned on.

7. The audio power amplifier as recited in claim 6, wherein said means for changing the biasing of said driver transistors from said predetermined operating point to said unbiased condition comprises a connection between said power source and said control transistor.

8. An audio power amplifier circuit comprising:
   an output circuit comprising at least a pair of output transistors connected in a push-pull configuration;
   a driver circuit coupled to said output circuit, said driver circuit comprising a pair of driver transistors;
   a voltage biasing circuit coupled to said driver circuit, said voltage biasing circuit biasing said pair of driver transistors of said driver circuit at a predetermined operating point during steady state conditions; and a control circuit coupled to said voltage biasing circuit, said control circuit controlling the biasing of said pair of driver transistors when a power source connected to said audio power amplifying circuit changes state, wherein said control circuit limits a rate at which the biasing of said driver transistors changes from an unbiased condition to said predetermined operating point when said power source is initially turned on, and wherein said control circuit also changes the biasing of said driver circuit from said predetermined operating point to said unbiased condition in a substantially instantaneous manner when said power source is turned off.

9. The audio power amplifier circuit of claim 8, wherein said voltage biasing circuit comprises a capacitor which charges when said power source is turned on to provide an increasing biasing voltage to the driver circuit.

10. The audio power amplifier circuit of claim 8, wherein at least one biasing diode is connected between said pair of driver transistors.

11. The audio power amplifier circuit of claim 8, wherein said control circuit comprises a capacitor and a control transistor, said control transistor turning on when said power source is first turned on and said control transistor turning off as said capacitor charges.

12. The audio power amplifier circuit of claim 11, wherein said control transistor substantially instantaneously turns off when said power source is turned off.

13. The audio power amplifier circuit of claim 8, wherein said output circuit comprises a coupling capacitor coupled between said output transistors, said coupling capacitor discharging through at least one resistor when said power source is turned off.

14. A method for amplifying an audio signal using at least a pair of driver transistors comprising the steps of:

limiting a rate at which the biasing of said pair of driver transistors changes from an unbiased condition to a predetermined operating point, said change in biasing occurring when a power source coupled to said pair of driver transistors is initially turned on;

biasing said pair of driver transistors at said predetermined operating point during steady state conditions; and substantially instantaneously changing the biasing of said pair of driver transistors from said predetermined operating point to said unbiased condition, said changing occurring when said power source is turned off.

* * * * *